United States Patent
Makovsky et al.

(10) Patent No.: US 12,416,649 B1
(45) Date of Patent: Sep. 16, 2025

(54) VOLTAGE DROOP DETECTION USING INVERTING STAGES

(71) Applicant: Amazon Technologies, Inc., Seattle, WA (US)

(72) Inventors: Lev Makovsky, Tal-El (IL); Yuri Geogdjaev, Netanya (IL); Ilan Shusterman, Tel Aviv-Jaffa (IL); Etai Wagner, Beit Hashmonai (IL)

(73) Assignee: Amazon Technologies, Inc., Seattle, WA (US)

( * ) Notice: Subject to any disclaimer, the term of this patent is extended or adjusted under 35 U.S.C. 154(b) by 82 days.

(21) Appl. No.: 18/478,058

(22) Filed: Sep. 29, 2023

(51) Int. Cl.
   *G01R 15/14* (2006.01)
(52) U.S. Cl.
   CPC .................................. *G01R 15/146* (2013.01)
(58) Field of Classification Search
   None
   See application file for complete search history.

(56) References Cited

U.S. PATENT DOCUMENTS

2023/0145626 A1* 5/2023 Rodriguez ..... H03K 19/017509
324/764.01

* cited by examiner

*Primary Examiner* — Jas A Sanghera
(74) *Attorney, Agent, or Firm* — Weaver Austin Villeneuve & Sampson LLP

(57) ABSTRACT

A voltage droop detection circuit can be used to detect a voltage droop in an integrated circuit (IC) device. The voltage droop detection circuit may include a chain of inverting stages, and each inverting stage may include a P-type transistor and an N-type transistor. The chain of inverting stages can be initialized to alternating logic states during an initialization phase of a clock cycle, and an evaluation pulse can be inputted into the chain of inverting stages during an evaluation phase of the clock cycle. A voltage droop may be detected if a number of inverting stages that are able to switch output logic states from their respective initialized logic states is smaller than a nominal value indicating a number of inverting stages that are able to switch their respective output logic states under normal voltage condition.

20 Claims, 7 Drawing Sheets

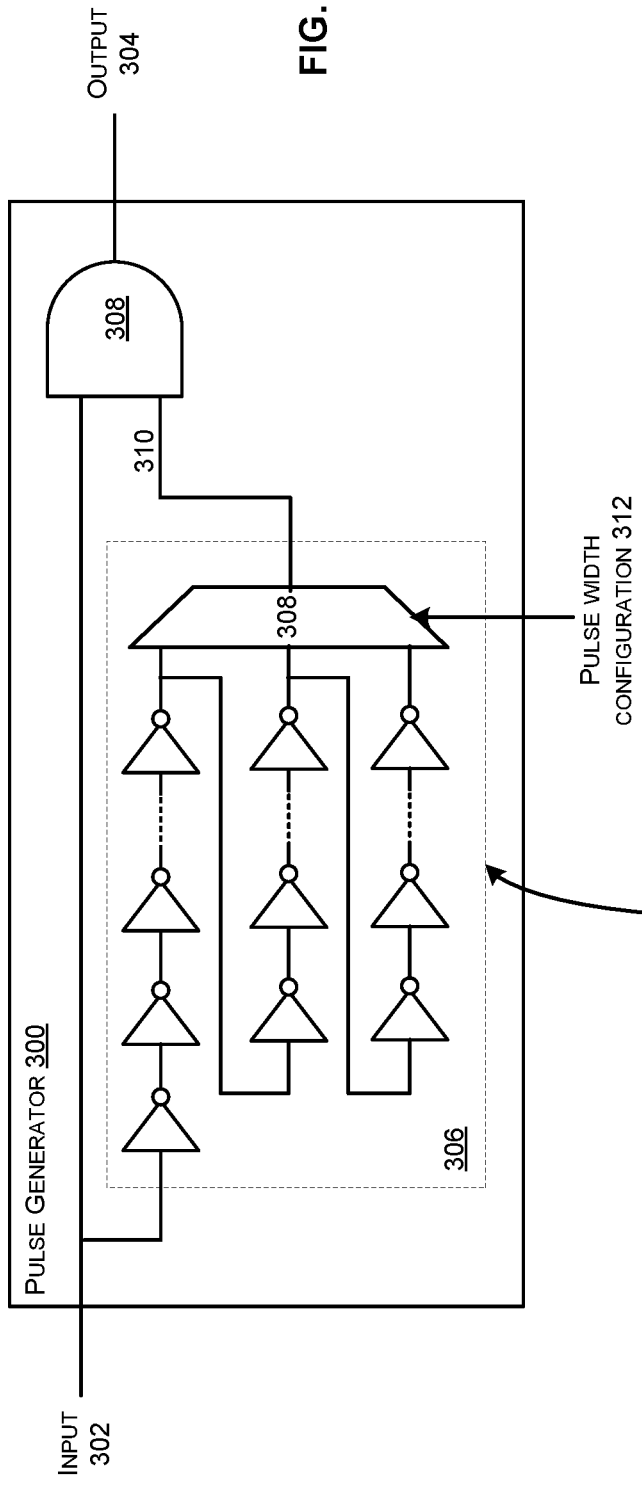
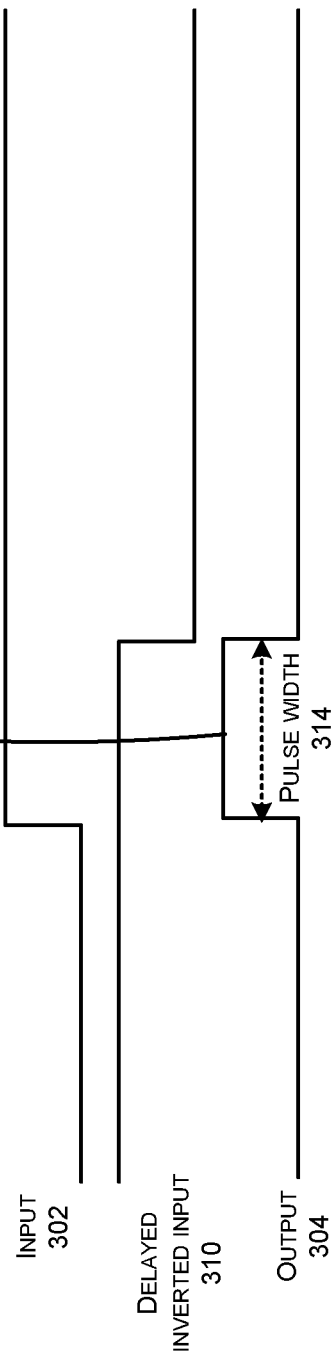
FIG. 3A
FIG. 3B

VOLTAGE DROOP DETECTION USING INVERTING STAGES

BACKGROUND

In some integrated circuit (IC) devices, a voltage droop may occur during a current spike, or when the current consumption changes due to fluctuations in the workload. In such cases, the power supply may not be able to maintain the nominal voltage of the IC device, and the device voltage may drop, causing timing violations at the IC device's operating frequency. Thus, for some IC devices with tight timing constraints, the voltage droop can cause erroneous operations such as logic errors and/or data corruption.

BRIEF DESCRIPTION OF THE DRAWINGS

Various embodiments in accordance with the present disclosure will be described with reference to the drawings, in which:

FIG. 3A illustrates an example of a pulse generator circuit that can be used to generate an output signal with a variable pulse width, in some embodiments;

FIG. 3B illustrates example waveforms for an input signal, a delayed inverted input signal, and an output signal, in some embodiments;

DETAILED DESCRIPTION

Figure 1:
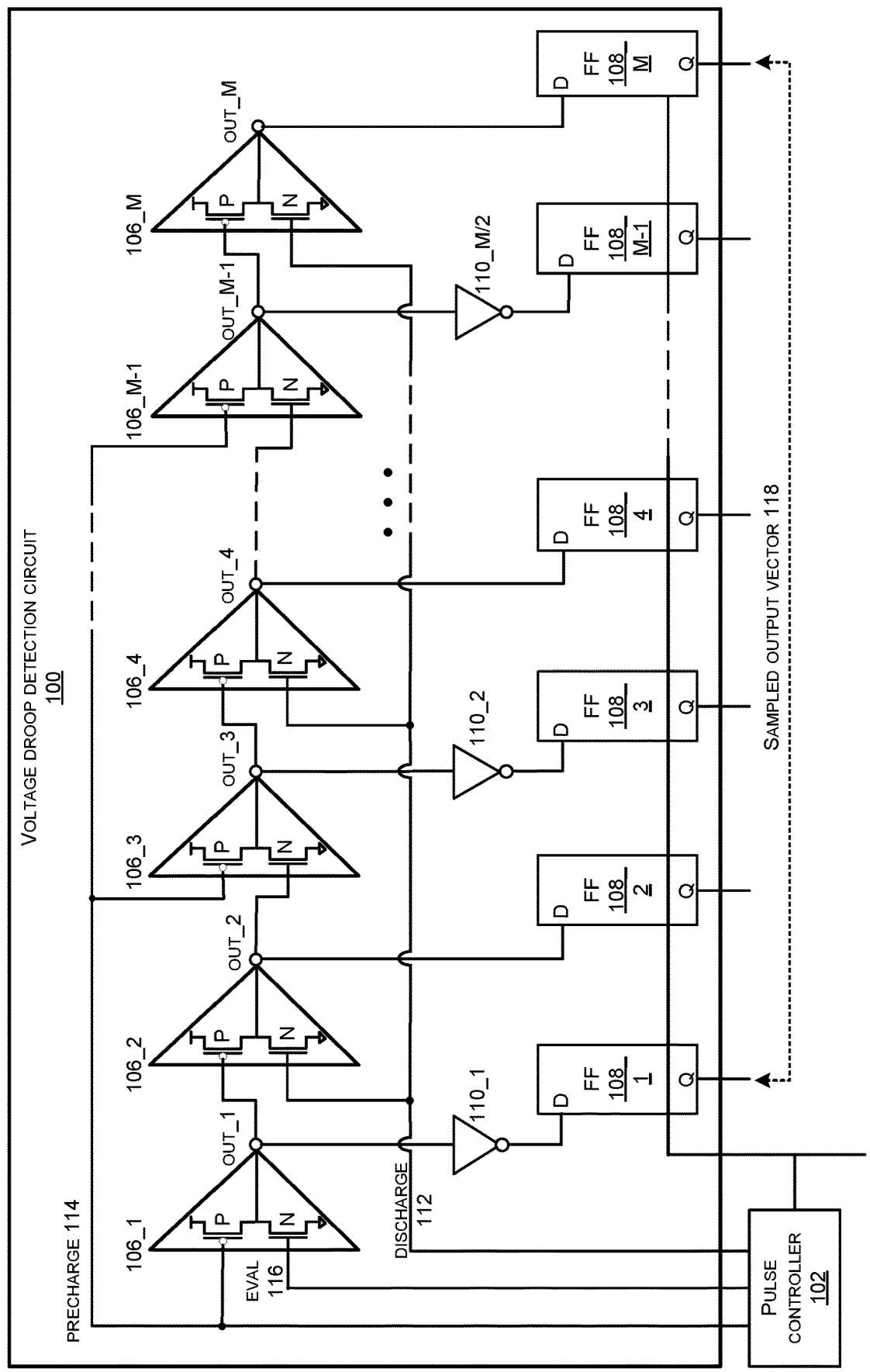
FIG. 1 illustrates an example of a voltage droop detection circuit that can be used to detect voltage droops in an integrated circuit (IC) device, according to some embodiments.

Voltage droops in an integrated circuit (IC) device can lead to erroneous operation since the timing constraints to operate at target frequencies may not be met when there is a drop in the voltage. The voltage droops may occur from sudden changes in the current consumption in the IC devices. Generally, the power supply is not fast enough to adjust the voltages based on the sudden current spikes, and therefore the voltage droops may occur. In some implementations, the drop in the voltage may be detected by measuring voltages across the IC devices. However, such solutions are not always reliable, and may not provide sufficient resolution to detect the voltage droop for IC devices running at higher frequencies (e.g., multiples of GHz).

In some implementations, a voltage droop can be detected by measuring the propagation delay of a signal through a chain of buffers. As the signal propagates through the chain, the output states of the buffers may switch one after another. If there is slowness in the IC device due to a drop in the voltage, the propagation delay of the signal may deteriorate, and fewer number of stages in the chain may switch states due to setup time violation. Generally, the resolution or accuracy of the deterioration that can be detected may depend on the switching speed of the buffers. For IC devices running at higher clock frequencies, a standard buffer chain may lack sufficient switching speed to achieve the desired resolution to detect voltage droops.

The techniques described herein can be used to detect voltage droops in an IC device using a voltage droop detection circuit comprising a plurality of inverting stages connected in a chain. Each inverting stage may include a P-type transistor and an N-type transistor. As an example, the P-type transistor can be a P-type metal oxide semiconductor (PMOS) field-effect transistor (FET), and the N-type transistor can be an N-type metal oxide semiconductor (NMOS) FET. An output of each odd-numbered inverting stage may connect to an input of the P-type transistor of a following even-numbered inverting stage, and an output of each even-numbered inverting stage may connect to an input of the N-type transistor of a following odd-numbered inverting stage to form a domino chain of inverting stages.

A voltage droop may be detected if a number of inverting stages that a signal is able to propagate through the domino chain is smaller as compared to a nominal value indicating how many inverting stages may switch their respective output logic states under the normal voltage condition. In some implementations, the voltage droop detection circuit may also include a plurality of flip-flops (FFs) that are respectively coupled to the plurality of inverting stages to sample the output logic states of the inverting stages at each clock cycle, which can be used to compare with the nominal value to detect the voltage droop.

In some implementations, the P-type transistor and the N-type transistor of each inverting stage can be driven separately to provide an inverted logic state at the output. This can provide a faster switching speed as compared to a standard chain of buffers, since there is no contention between the P-type transistor and the N-type transistor during switching time. In a first phase of the voltage droop detection, all the inverting stages in the domino chain may be initialized to a known logic state from their default high impedance (e.g., high-Z) state. For example, the P-type transistor of each odd-numbered inverting stage may be driven by a precharge signal to initialize the odd-numbered inverting stage to a known logic state (e.g., "1"), and the N-type transistor of each even-numbered inverting stage may be driven by a discharge signal to initialize the even-numbered inverting stage to an inverse of the known logic state (e.g., "0"). The discharge signal can be generated by a pulse generator circuit using a clock signal, and inverted to generate the precharge signal.

In a second phase of the voltage droop detection, an evaluation (or simply "eval") pulse signal can be inputted into the voltage droop detection circuit, and the propagation of the signal through the domino chain can be monitored to determine how many inverting stages are able to switch output logic states from their respective initialized logic states. A voltage droop can be detected by comparing a number of inverting stages that are able to switch their output logic states to the nominal value representing the nominal supply voltage. The faster switching speed of the domino chain provides a finer resolution to detect smaller degradation in the propagation delay. If at least a threshold number of fewer inverting stages are able to switch their output logic states as compared to the nominal value, it may be an indication of a drop in the supply voltage. The threshold number may represent a delta (i.e., threshold delta) from the nominal value, and can be defined to be large enough to not account for the voltage drops that may occur due to noise in the IC device. For example, if there are 100 inverting stages in the voltage droop detection circuit, and 80 of those inverting stages switch output logic states under normal voltage condition, a voltage droop may be detected if less than 75 inverting stages are able to switch their output logic states, when the threshold delta is defined as 5.

When a voltage droop is detected, an operating frequency of the IC device may be reduced to avoid the timing violations due to the drop in the voltage, and prevent the IC device from malfunctioning. The operating frequency of the IC device can be restored, when the number of inverting stages that are able to switch output logic states reach within a threshold number of the nominal value, and the IC device can revert back to the normal operating frequency without impacting the system performance. In some implementations, the IC device may include a plurality of such voltage droop detection circuits to detect voltage droops of different logic blocks in the IC device, since the current loads of different logic blocks may vary at different times of operation.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiments being described.

FIG. 1 illustrates an example of a voltage droop detection circuit 100 that can be used to detect voltage droops in an IC device, according to some embodiments. The IC device may include a plurality of logic blocks based on the functionality supported by the IC device.

The voltage droop detection circuit 100 may include a plurality of inverting stages that are connected in a chain comprising inverting stages 106_1, 106_2, 106_3, 106_4, ..., 106_M-1, and 106_M. Each of the inverting stages 106_1 to 106_M may include a P-type transistor and an N-type transistor that can be driven by separate input signals. In some implementations, the P-type transistor and the N-type transistor can be examples of metal oxide semiconductor field-effect transistors (MOSFETs). FIG. 1 shows each of the inverting stages 106_1 to 106_M having a P-type transistor represented by a "P", and an N-type transistor represented by an "N." For each of the M inverting stages, the P-type transistor may be connected to the source (e.g., power or VDD), and the N-type transistor may be connected to the drain (e.g., GND or VSS). The output of each inverting stage can be in high impedance (high-Z) state when neither input is driven.

In some implementations, the output of each odd-numbered inverting stage may be connected to the input of the P-type transistor of a following even-numbered inverting stage, and the output of each even-numbered inverting stage may be connected to the input of the N-type transistor a following odd-numbered inverting stage. For example, when M is an even integer (e.g., 100, 150, 200, etc.), the odd-numbered inverting stages may include the inverting stages 106_1, 106_3, ..., and 106_M-1, and the even-numbered inverting stages may include the inverting stages 106_2, 106_4, ..., and 106_M. Thus, as shown in FIG. 1, an output out_1 of the inverting stage 106_1 may be connected to the input of the P-type transistor of the inverting stage 106_2, an output out_3 of the inverting stage 106_3 may be connected to an input of the P-type transistor of the inverting stage 106_4, and an output out_M-1 of the inverting stage 106_M-1 may be connected to an input of the P-type transistor of the inverting stage 106_M. Similarly, an output out_2 of the inverting stage 106_2 may be connected to an input of the N-type transistor of the inverting stage 106_3, and an output of an inverting stage 106_M-2 (not shown) may be connected to an input of the N-type transistor of the inverting stage 106_M-1.

The voltage droop detection circuit 100 may also include a plurality of flip-flops (FFs) respectively coupled to the plurality of inverting stages to sample the output logic states of the inverting stages at each clock cycle. As shown in FIG. 1, a FF 108_1 may be coupled to the inverting stage 106_1, a FF 108_2 may be coupled to the inverting stage 106_2, a FF 108_3 may be coupled to the inverting stage 106_3, a FF 108_4 may be coupled to the inverting stage 106_4, a FF 108_M-1 may be coupled to the inverting stage 106_M-1, and a FF 108_M may be coupled to the inverting stage 106_M. In some implementations, each odd-numbered inverting stage may be coupled to a corresponding FF via an inverter. For example, the inverting stage 106_1 may be coupled to the FF 108_1 via an inverter 110_1, the inverting stage 106_3 may be coupled to the FF 108_3 via an inverter 110_3, and the inverting stage 106_M-1 may be coupled to the FF 108_M-1 via an inverter 110_M/2. In some examples, a sampled output vector 118 may represent the sampled output logic states of the inverting stages 106_1 to 106_M at each clock cycle.

A pulse controller circuit 102 can be used to generate a discharge signal 112, a precharge signal 114, and an eval pulse signal 116 based on a clock (clk) signal 104. The discharge signal 112 and the precharge signal 114 may be used to initialize the chain of inverting stages 106_1 to 106_M to alternating logic states during an initialization phase of the clock cycle. As shown in FIG. 1, the precharge signal 114 may be applied to the input (e.g., gate) of the P-type transistor of all the odd-numbered inverting stages in the domino chain, e.g., the inverting stages 106_1, 106_3, ..., and 106_M-1, to drive the respective outputs to a known logic state, e.g., a logic state "1.". Similarly, the discharge signal 112 may be applied to the input (e.g., gate) of the N-type transistor of all the even-numbered inverting stages in the domino chain, e.g., the inverting stages 106_2, 106_4, ..., and 106_M, to drive the respective outputs to an inverse of the known logic state, e.g., a logic state "0." Thus, the discharge signal 112 and the precharge signal 114 can be applied to prepare the inverting stages to be in the known logic states, which can provide a faster propagation delay through the chain during an evaluation phase and accelerate the voltage droop detection process.

The eval pulse signal 116 may be inputted into the chain of inverting stages 106_1 to 106_M during the evaluation phase of the clock cycle. For example, the eval pulse signal 116 may be applied to the input (e.g., gate) of the N-type transistor of the first inverting stage in the chain, e.g., the inverting stage 106_1, to trigger the switching of the output logic states of the inverting stages as the signal is propagated through the domino chain. Under the normal voltage conditions, the number of inverting stages that may switch their respective output logic states from their initialized logic states may represent a nominal value corresponding to a nominal voltage supply. However, when there is a drop in the voltage, the number of inverting stages that switch their respective output logic states from their initialized logic states may be smaller than the nominal value. Generally, the voltage droop detection circuit 100 may include more inverting stages than the nominal value. Thus, the value of M will always be greater than the nominal value.

In some instances, the number of inverting stages that switch their output logic states may differ between consecutive clock cycles only by a small amount due to noise. In some implementations, in order to filter out the noise, the number of inverting stages that switch output states can be compared with the nominal value to determine if at least a threshold number of fewer inverting stages can switch their output logic states as compared to the nominal value. The threshold number may represent a delta (i.e., threshold delta) from the nominal value, and can be defined to be large enough to filter out the voltage drops caused by the noise in the IC device. For example, with the 100 inverting stages in the voltage droop detection circuit, if the nominal value represents 80 inverting stages that switch output logic states under normal voltage condition, then a voltage droop is detected if the number of inverting stages that switch their output logic states is 75 or below. Hence, in this example, at least 5 fewer switching stages than the nominal value is needed to trigger the voltage droop. The threshold delta can be configured based on the values of the expected noise level in the IC device, clock frequency, and the supply voltage level, among other factors.

In some implementations, the sampled output vector 118 can be compared in each clock cycle with the sampled output vector 118 corresponding to the nominal value. For example, the sampled output vector 118 for M having a value of 100 may include 80 bits with a value of logic 1 and remaining 20 bits with a value of logic 0 representing the nominal value. If there is a voltage drop due to noise, the comparison of the sampled output vector 118 may only differ by a small number of bits causing a false positive outcome. For example, in this case, the sampled output vector 118 may include 77 or 76 bits with a value of logic 1 and remaining bits with a value of logic 0. However, the voltage droop is detected when the sampled output vector 118 includes 75 or fewer bits with a value of logic 1 and remaining bits with a value of logic 0, when the threshold delta is defined as 5.

In response to detection of the voltage droop, an operating frequency of the IC device may be reduced, and different logic blocks of the IC device may be operated at a slower clock frequency in order to meet the timing constraints and prevent the IC device from malfunctioning. However, the voltage droop detection circuit 100 may continue operating at the original clock frequency. The operating frequency of the IC device may be restored when the number of inverting stages that is able to switch output logic states reaches to within a threshold number of the nominal value. For example, if the nominal value is 80 inverting stages, a threshold number of the nominal value to restore the frequency can be 2. Thus, the operating frequency of the IC device may be reduced for a minimum duration of time when the voltage droop is detected, and can be restored back to the original frequency when the number of inverting stages that is able to switch output logic states goes back up to at least 78 stages.

Figure 2:
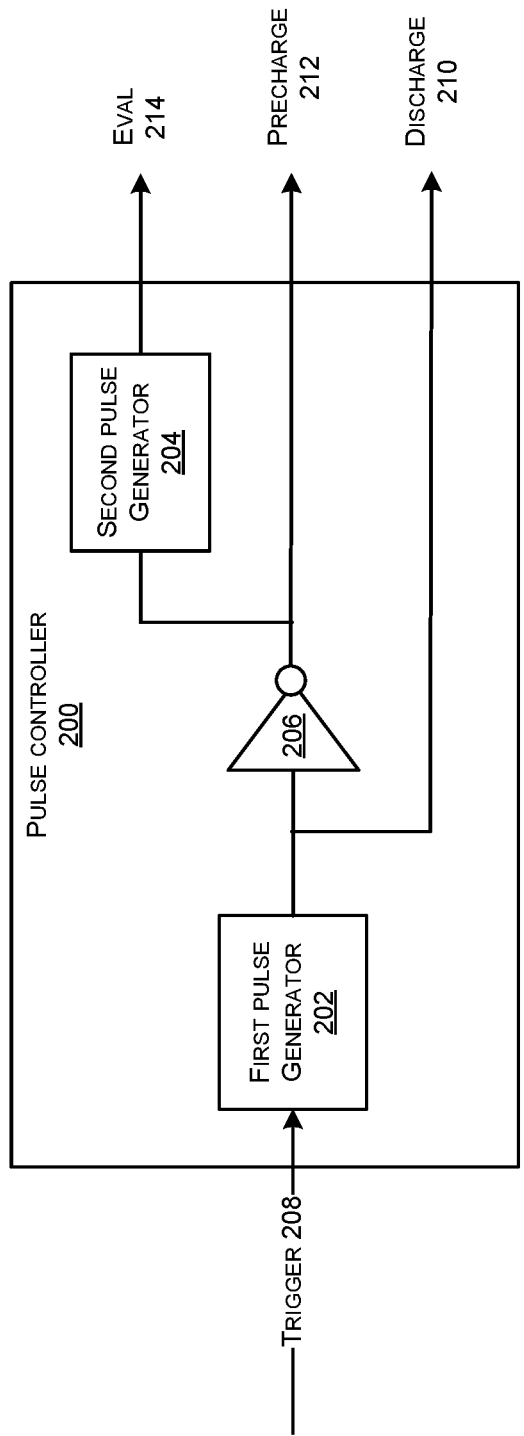
FIG. 2 illustrates an example of a pulse controller circuit that can be used to generate a precharge signal, a discharge signal, and an eval pulse signal, in some embodiments.

FIG. 2 illustrates an example of a pulse controller circuit 200 that can be used to generate a precharge signal, a discharge signal, and an eval pulse signal, in some embodiments. The pulse controller circuit 200 can be an example of the pulse controller circuit 102.

The pulse controller circuit 200 may include a first pulse generator circuit 202, a second pulse generator circuit 204, and an inverter 206. The first pulse generator circuit 202 and the second pulse generator circuit 204 may each be configurable to generate a variable pulse width. The first generator 202 may be operable to generate a discharge signal 210 based on an input trigger signal 208. In some examples, the input trigger signal 208 may be driven by the clk signal 104. The inverter 206 may be used to generate a precharge signal 212 based on the discharge signal 210. The second pulse generator 204 can be used to generate an eval pulse signal 214 based on the precharge signal 212. An example pulse generator circuit is shown in FIG. 3A that can be used to generate an output signal with a variable pulse width. FIG. 3A illustrates an example of a pulse generator circuit 300 that can be used to generate an output signal with a variable pulse width, in some embodiments. The pulse generator circuit 300 can be an example of the first pulse generator circuit 202 and the second pulse generator circuit 204.

The pulse generator circuit 300 may be operable to generate an output signal 304 based on an input signal 302 and a pulse width configuration 312. The pulse generator circuit 300 may include a delay circuit 306 and an AND gate 308. The delay circuit 306 may include a plurality of inverters connected in a chain to apply different amounts of delay to the input signal, and a multiplexer (mux) 308 to select between different portions of the chain with varying delay to generate a delayed inverted input signal 310. In some examples, the plurality of inverters may include an odd number of inverters in the chain to provide the delayed inverted input signal 310 to the AND gate 308. In some examples, the delay circuit 306 may be implemented using buffers, or a combination of inverters and buffers. The AND gate 308 may perform a logical AND on the inputs 302 and 310 to generate the output 304. The mux 308 may use the pulse width configuration 312 to select one of the portions of the chain having an amount of delay corresponding to the number of inverters in that portion. The pulse width configuration 312 can be configured by the software executing on the IC device and/or the hardware to control the width of the output signal 304 as shown in FIG. 3B.

FIG. 3B illustrates example waveforms for the input signal 302, the delayed inverted input signal 310, and the output signal 304, in some embodiments.

In some examples, the input signal 302 can be driven by the clk signal 104 used by the IC device. FIG. 3B shows an example of a rising edge of the input signal 302, which gets delayed and inverted using the delay circuit 306 to provide the delayed inverted input signal 310. The output signal 304 representing a logical AND of the input signal 302 and the delayed inverted input signal 310 may have a pulse width 314 corresponding to the delay introduced by the delay circuit 306 based on the pulse width configuration 312. The pulse width 314 may be different for the discharge signal 210/precharge signal 212 and the eval pulse signal 214 by configuring the corresponding pulse width configuration 312 accordingly so that sufficient amount of time is available for both the initialization phase and the evaluation phase of the clock cycle.

For example, the pulse width 314 for the discharge signal 210/precharge signal 212 may be determined by the corresponding pulse width configuration 312 to allow the inverting stages 106_1 to 106_M to reach the expected logic state based on the supply voltages, and enable the rising edge of the eval pulse signal 214 in a timely manner so that it can be propagated through the domino chain within the current clock cycle. Furthermore, the pulse width 314 for the eval pulse signal 214 may be determined by the corresponding pulse width configuration 312 to allow the inverting stage 106_1 to reach the expected logic state based on the supply voltages for the current clock cycle.

Figure 4:
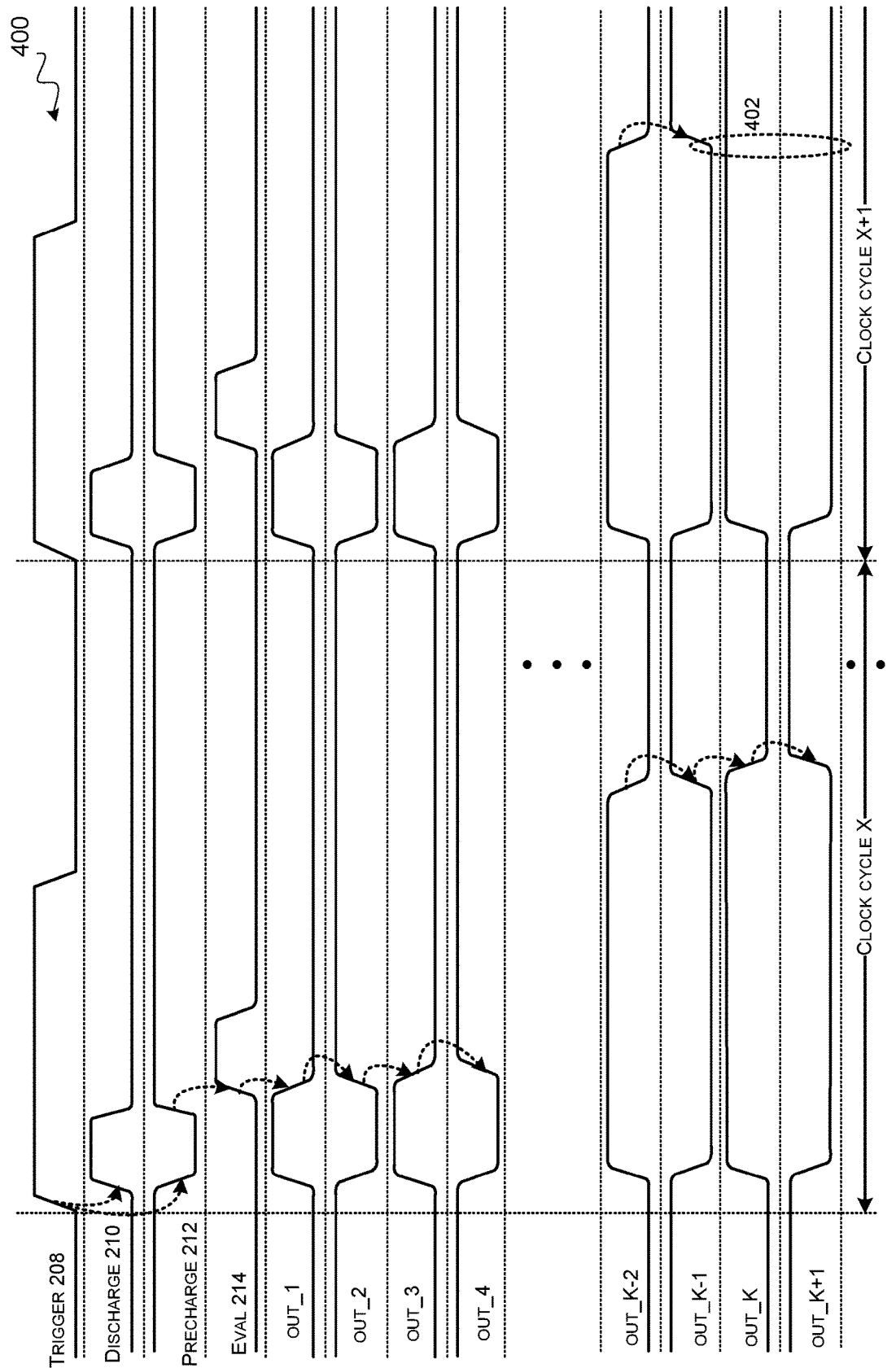
FIG. 4 illustrates waveforms for propagation of a signal through the inverting stages of the voltage droop detection circuit, according to some embodiments.

FIG. 4 illustrates waveforms 400 for propagation of a signal through the inverting stages of the voltage droop detection circuit 100, according to some embodiments.

As an example, the trigger signal 208 can be driven by the clk signal 104 in FIG. 1 to perform voltage droop detection in the IC device. The discharge signal 210 and the precharge signal 212 may be generated from the rising edge of the trigger signal 208, which can initialize the chain of inverting stages 106_1 to 106_N to alternating logic states during an initialization phase of a clock cycle X of the clk signal 104. For example, as shown in FIG. 4, the odd-numbered inverting stages (e.g., out_1, out_3, . . . , out_K-2, out_K, . . . , out_M-1) may be initialized to a logic state 1, and the even-numbered inverting stages (e.g., out_2, out_4, . . . , out_K-1, out_K+1, . . . , out_M) may be initialized to a logic state 0. K can be a positive integer that is smaller than M.

The eval pulse signal 214 may be generated to start the evaluation phase of the clock cycle when the precharge signal 212 is de-asserted (e.g., rising edge of precharge signal 212). The pulse widths of the discharge signal 210, precharge signal 212, and the eval pulse signal 214 can be varied based on the corresponding pulse width configuration 312 for different signals. As shown in FIG. 4, the rising edge of the eval pulse signal 214 may cause the output out_1 of the inverting stage 106_1 to switch from the initialized logic state of logic 1 to logic 0, which may cause the output out_2 of the inverting stage 106_2 to switch from the initialized logic state of logic 0 to logic 1. Similarly, the outputs out_3 and out_4 of the inverting stages 106_3 and 106_4, respectively, may switch to the inverse of their corresponding initialized logic state.

As described previously, the nominal value can be determined by applying the eval pulse signal 214 into the voltage droop detection circuit 100 under normal voltage condition and determining how many inverting stages switched their respective output logic state based on the sampled output vector 118. For example, FIG. 4 shows the outputs out_K-2, out_K-1, out_K, and out_K+1 of the respective inverting stages 106_K-2, 106_K-1, 106_K, and 106_K+1 (not shown in FIG. 1) switching their logic states in the clock cycle X. However, if there is a voltage droop in the clock cycle X+1, some of the inverting stages that were able to switch previously may no longer be able to switch the output logic states from their initialized logic states. As shown in FIG. 4, only the inverting stages 106_K-2 and 106_K-1 are able to switch their output logic states from the initialized logic states 1 and 0 to the logic states 0 and 1, respectively, in the clock cycle X+1. However, when a voltage droop occurs, the inverting stages 106_K and 106_K+1 are not able to switch their output logic states out_K and out_K+1, respectively, as indicated by an oval 402, due to missing the setup time requirements, and stay in their initialized logic states 1 and 0 respectively.

Figure 5:
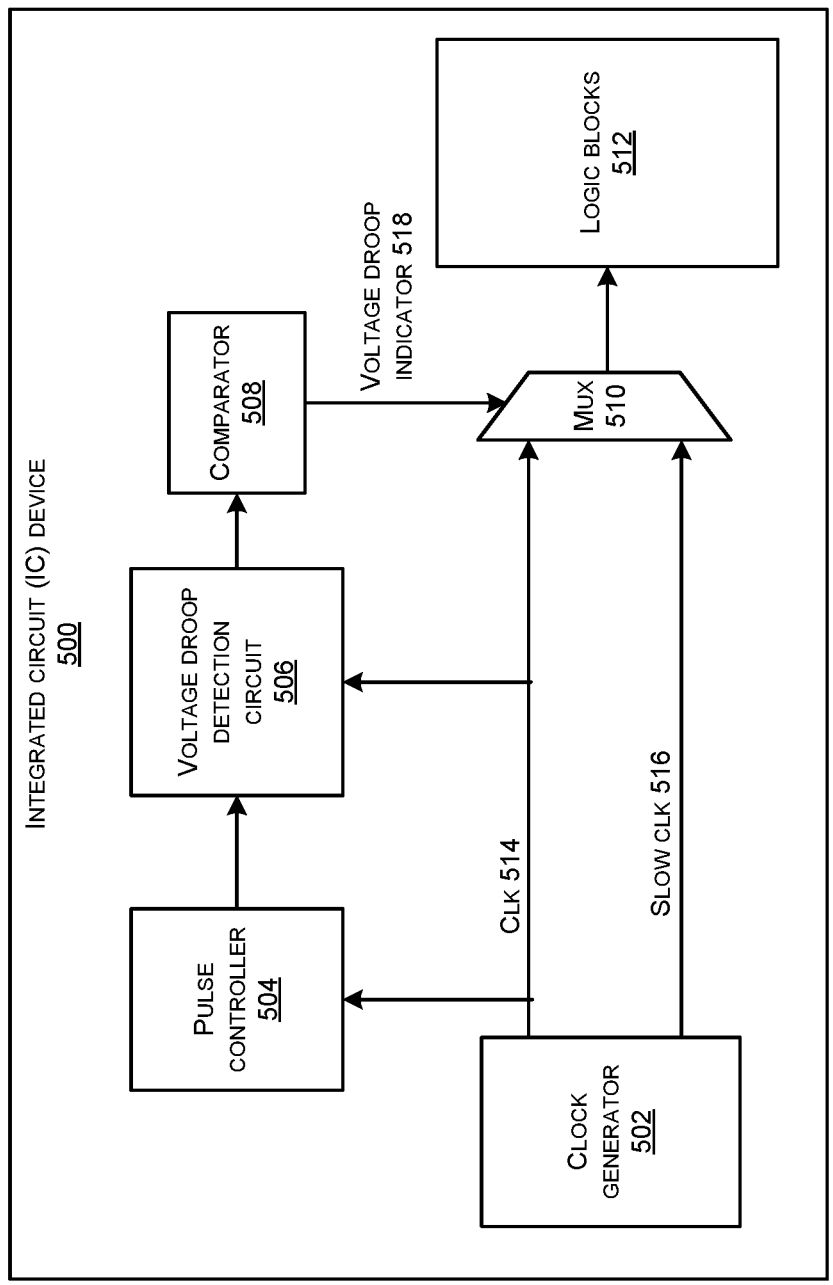
FIG. 5 shows an example block diagram of an IC device comprising a voltage droop detection circuit, according to some embodiments.

FIG. 5 shows an example block diagram of an IC device 500 comprising a voltage droop detection circuit, according to some embodiments.

The IC device 500 may comprise a clock generator circuit 502, a pulse controller circuit 504, a voltage droop detection circuit 506, a comparator 508, a mux 510, and logic blocks 512. The clock generator 502 may include circuitry to generate a clk signal 514 and a slow clk signal 516. In some implementations, the clock generator circuit 502 may include a phase locked loop (PLL) circuit or other clock source that can generate clock signals with different frequencies. For example, the clock generator circuit 502 may generate the clk signal 514 with a clock frequency corresponding to a normal voltage condition, and the slow clk signal 516 with a slower clock frequency corresponding to a voltage droop condition.

The pulse controller circuit 504 can be an example of the pulse controller circuit 200, and the voltage droop detection circuit 506 can be an example of the voltage droop detection circuit 100. The pulse controller circuit 504 and the voltage droop detection circuit 506 may operate using the clk signal 514. A comparator 508 may be used to compare the output logic states of the inverting stages against the nominal value to generate a voltage droop indicator signal 518. In some implementations, the comparator 508 may store the sampled output vector 118 corresponding to the nominal value in a memory or a register (not shown) to compare with the sampled output vector 118 for the current clock cycle to detect a voltage droop in the current clock cycle. When a voltage droop is detected, a mux 510 may select the slow clk signal 516 based on the voltage droop indicator signal 518 indicating a voltage droop condition. When there is no voltage droop detected, the mux 510 may select the clk signal 514 based on the voltage droop indicator signal 518 indicating the normal voltage condition. Note that the pulse controller circuit 504 and the voltage droop detection circuit 506 may continue using the clk signal 514 even when the voltage droop is detected. When the voltage droop condition is resolved, the voltage droop indicator signal 518 may be de-asserted by the comparator 508, which may allow the mux 510 to select the clk signal 514 to be used by the logic blocks 512.

In some embodiments, a plurality of voltage droop detection circuits 506 can be placed in the IC device 500 corresponding to different logic blocks. For example, in some cases, the IC device 500 may include a system-on-a-chip (SoC) with multiple processing cores. In such cases, one voltage droop detection circuit 506 per processing core can be placed in its proximity. In some implementations, the voltage droop detection circuits 506 can be placed across different areas of the IC device 500 that are prone to high currents, or high current spikes, such as, floating point computation units. Thus, the placement of different voltage droop detection circuits for different logic blocks of the IC device 500 can be performed based on the size of the IC device 500, functionality supported by the IC device 500, system specification, power supply voltages, or IC design process technology, among other factors. It should also be noted that the nominal value being compared to trigger a voltage droop can vary between different voltage droop detection circuits at different locations of the IC device 500.

Figure 6:
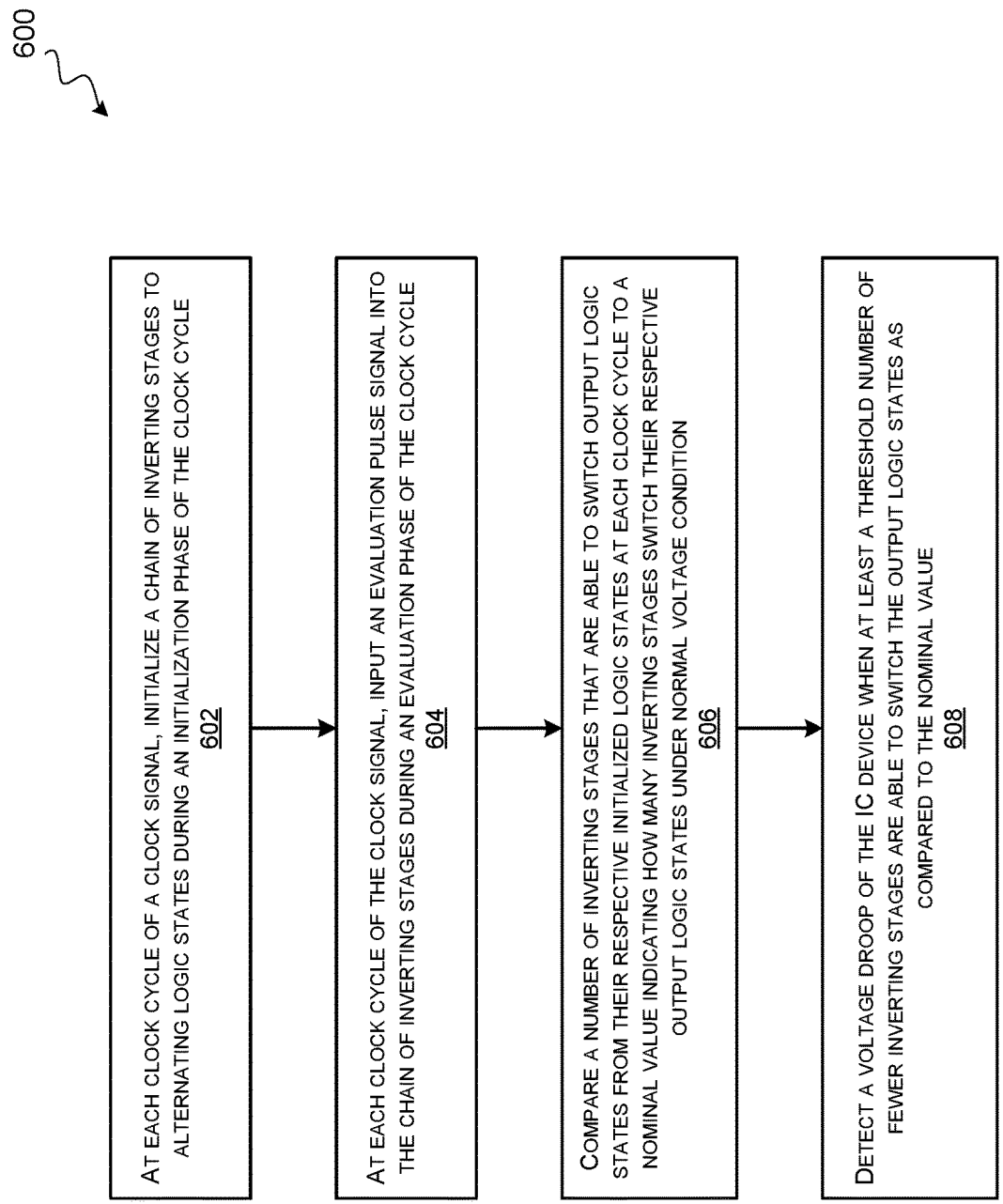
FIG. 6 shows an example flowchart for a method to detect voltage droop in an IC device, according to some embodiments.

FIG. 6 shows an example flowchart 600 for a method to detect voltage droop in an IC device, according to some embodiments. For example, the method may be executed by the voltage droop detection circuit 100, or the voltage droop detection circuit 506 to detect voltage droop in the IC device 500.

In step 602, the method includes, at each clock cycle of a clock signal, initializing a chain of inverting stages to alternating logic states during an initialization phase of the clock cycle. As described with reference to FIG. 1, at each clock cycle of the clock signal 104, the chain of inverting stages 106_1 to 106_M may be initialized to the alternating logic states. For example, as shown in FIG. 4, by driving the trigger signal 208 with the clock signal 104, the inverting stage 106_1 may be initialized to the logic state 1, the inverting stage 106_2 may be initialized to the logic state 0, the inverting stage 106_3 may be initialized to the logic state 1, the inverting stage 106_4 may be initialized to the logic state 0, and so on, based on the discharge pulse 210 and the precharge pulse 212 during the initialization phase of the clock signal 104.

In step 604, the method further includes, at each clock cycle of the clock signal, inputting an evaluation pulse signal into the chain of inverting stages during an evaluation phase of the clock cycle. As shown in FIG. 4, the eval pulse signal 214 is inputted into the inverting stage 106_1 during the evaluation phase of the clock signal 104, which can cause switching of the output logic states from their initialized logic states as the signal is propagated in the chain of inverting stages. The discharge pulse 210, the precharge pulse 212, and the eval pulse signal 214 may be generated by the pulse controller circuit 504 when the clk signal 514 drives the trigger signal 208. The FFs 108_1 to 108_M may sample the output logic states of the inverting stages 106_1 to 106_M to provide the sampled output vector 118 in each clock cycle. Every other output may be inverted as shown in FIG. 1 using the corresponding inverters 110_1 to 110_M/2 before getting sampled by the corresponding FF so that the sampled output vector 118 has all 1s or 0s for the outputs that have switched logic states.

In step 606, the method further includes comparing a number of inverting stages that are able to switch output logic states from their respective initialized logic states at each clock cycle to a nominal value indicating how many inverting stages switch their respective output logic states under normal voltage condition. The voltage droop detection circuit 506 may provide the sampled output vector 118 to the comparator 508 in each clock cycle, which can be compared by the comparator 508 with the sampled output vector 118 for the nominal value that was determined under the normal voltage condition using the nominal supply voltage.

In step 608, the method further includes detecting a voltage droop of the IC device when at least a threshold number of fewer inverting stages are able to switch the output logic states as compared to the nominal value. For example, as described with reference to FIG. 4, when a voltage droop occurs, the inverting stages 106_K and 106_K+1 are not able to switch their output logic states out_K and out_K+1, respectively, in the clock cycle X+1 as shown by the oval 402, and stay in their initialized logic states 1 and 0, respectively, until the next clock cycle. In this case, the comparator 508 may detect a voltage droop and assert the voltage droop indicator 518, which may enable the mux 510 to select the slow clk signal 516 indicating a voltage droop condition. Thus, the operating frequency of the IC device 500 may be reduced. When the voltage droop condition is resolved, the voltage droop indicator signal 518 may be de-asserted by the comparator 508, which may allow the mux 510 to select the clk signal 514 for the logic blocks 512 to restore the operating frequency of the IC device 500.

Thus, the voltage droop detection circuit described herein can be used to detect voltage droops in an IC device using a smaller number of inverting stages for the propagation delay due to the precharge/discharge of the inverting stages during the initialization phase of the clock cycle. Furthermore, the separation of the P-type and the N-type transistors in each inverting stage can provide a faster way to perform voltage droop detection as compared to the chain of buffers since only the precharge or the discharge of each inverting stage may occur in the evaluation phase of the clock cycle.

Figure 7:
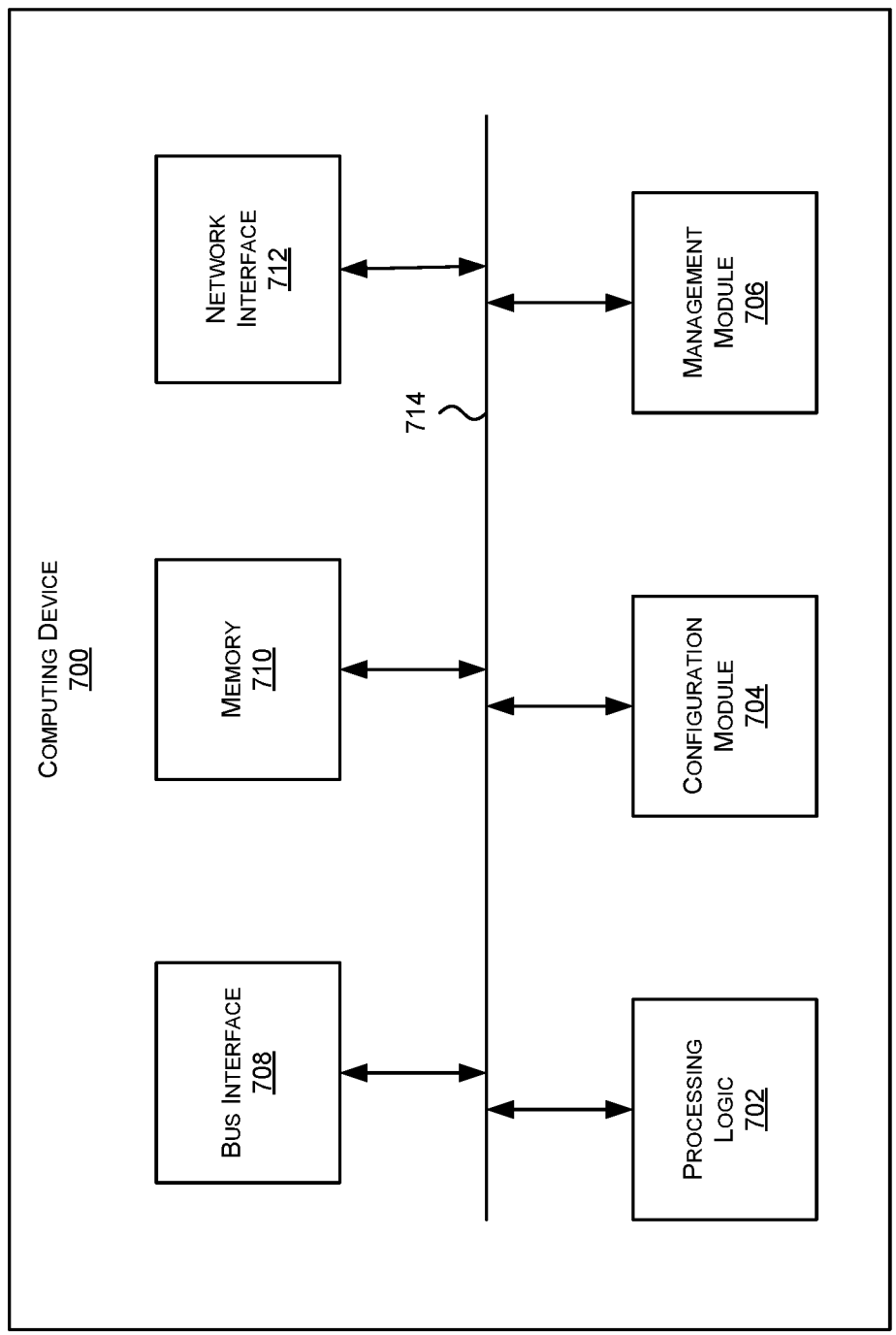
FIG. 7 illustrates an example of a computing device, according to certain aspects of the disclosure.

FIG. 7 illustrates an example of a computing device 700. Functionality and/or several components of the computing device 700 may be used without limitation with other embodiments disclosed elsewhere in this disclosure, without limitations. In some embodiments, the computing device can be an example of the IC device 500 comprising one or more voltage droop detection circuits 506.

In one example, the computing device 700 may include processing logic 702, a configuration module 704, a management module 706, a bus interface module 708, memory 710, and a network interface module 712. These modules may be hardware modules, software modules, or a combination of hardware and software. In certain instances, modules may be interchangeably used with components or engines, without deviating from the scope of the disclosure. The computing device 700 may include additional modules, which are not illustrated here. In some implementations, the computing device 700 may include fewer modules. In some implementations, one or more of the modules may be combined into one module. One or more of the modules may be in communication with each other over a communication channel 714. The communication channel 714 may include one or more busses, meshes, matrices, fabrics, a combination of these communication channels, or some other suitable communication channel.

The processing logic 702 may include application specific integrated circuits (ASICs), field programmable gate arrays (FPGAs), systems-on-chip (SoCs), network processing units (NPUs), processors configured to execute instructions or any other circuitry configured to perform logical arithmetic and floating point operations. Examples of processors that may be included in the processing logic 702 may include processors developed by ARM®, MIPS®, AMD®, Intel®, Qualcomm®, and the like. In certain implementations, processors may include multiple processing cores, wherein each processing core may be configured to execute instructions independently of the other processing cores. Furthermore, in certain implementations, each processor or processing core may implement multiple processing threads executing instructions on the same processor or processing core, while maintaining logical separation between the multiple processing threads. Such processing threads executing on the processor or processing core may be exposed to software as separate logical processors or processing cores. In some implementations, multiple processors, processing cores or processing threads executing on the same core may share certain resources, such as for example busses, level 1 (L1) caches, and/or level 2 (L2) caches. The instructions executed by the processing logic 702 may be stored on a computer-readable storage medium, for example, in the form of a computer program. The computer-readable storage medium may be non-transitory. In some cases, the computer-readable medium may be part of the memory 710.

The memory 710 may include either volatile or non-volatile, or both volatile and non-volatile types of memory. The memory 710 may, for example, include random access memory (RAM), read only memory (ROM), Electrically Erasable Programmable Read-Only Memory (EEPROM), flash memory, and/or some other suitable storage media. In some cases, some or all of the memory 710 may be internal to the computing device 700, while in other cases some or all of the memory may be external to the computing device 700. The memory 710 may store an operating system comprising executable instructions that, when executed by the processing logic 702, provides the execution environment for executing instructions providing networking functionality for the computing device 700. The memory may also store and maintain several data structures and routing tables for facilitating the functionality of the computing device 700.

In some implementations, the configuration module 704 may include one or more configuration registers. Configuration registers may control the operations of the computing device 700. In some implementations, one or more bits in the configuration register can represent certain capabilities of the computing device 700. Configuration registers may be programmed by instructions executing in the processing logic 702, and/or by an external entity, such as a host device, an operating system executing on a host device, and/or a remote device. The configuration module 704 may further include hardware and/or software that control the operations of the computing device 700.

In some implementations, the management module 706 may be configured to manage different components of the computing device 700. In some cases, the management module 706 may configure one or more bits in one or more configuration registers at power up, to enable or disable certain capabilities of the computing device 700. In certain implementations, the management module 706 may use processing resources from the processing logic 702. In other implementations, the management module 706 may have processing logic similar to the processing logic 702, but segmented away or implemented on a different power plane than the processing logic 702.

The bus interface module 708 may enable communication with external entities, such as a host device and/or other components in a computing system, over an external communication medium. The bus interface module 708 may include a physical interface for connecting to a cable, socket, port, or other connection to the external communication medium. The bus interface module 708 may further include hardware and/or software to manage incoming and outgoing transactions. The bus interface module 708 may implement a local bus protocol, such as Peripheral Component Interconnect (PCI) based protocols, Non-Volatile Memory Express (NVMe), Advanced Host Controller Interface (AHCI), Small Computer System Interface (SCSI), Serial Attached SCSI (SAS), Serial AT Attachment (SATA), Parallel ATA (PATA), some other standard bus protocol, or a proprietary bus protocol. The bus interface module 708 may include the physical layer for any of these bus protocols, including a connector, power management, and error handling, among other things. In some implementations, the computing device 700 may include multiple bus interface modules for communicating with multiple external entities. These multiple bus interface modules may implement the same local bus protocol, different local bus protocols, or a combination of the same and different bus protocols.

The network interface module 712 may include hardware and/or software for communicating with a network. This network interface module 712 may, for example, include physical connectors or physical ports for wired connection to a network, and/or antennas for wireless communication to a network. The network interface module 712 may further include hardware and/or software configured to implement a network protocol stack. The network interface module 712 may communicate with the network using a network protocol, such as for example TCP/IP, Infiniband, RoCE, Institute of Electrical and Electronics Engineers (IEEE) 802.11 wireless protocols, User Datagram Protocol (UDP), Asynchronous Transfer Mode (ATM), token ring, frame relay, High Level Data Link Control (HDLC), Fiber Distributed Data Interface (FDDI), and/or Point-to-Point Protocol (PPP), among others. In some implementations, the computing device 700 may include multiple network interface modules, each configured to communicate with a different network. For example, in these implementations, the computing device 700 may include a network interface module for communicating with a wired Ethernet network, a wireless 802.11 network, a cellular network, an Infiniband network, etc.

The various components and modules of the computing device 700, described above, may be implemented as discrete components, as a System on a Chip (SoC), as an ASIC, as an NPU, as an FPGA, or any combination thereof. In some embodiments, the SoC or other component may be communicatively coupled to another computing system to provide various services such as traffic monitoring, traffic shaping, computing, etc. In some embodiments of the technology, the SoC or other component may include multiple subsystems.

The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The modules may be configured in the manner suggested in FIG. 7, and/or functions described herein can be provided by one or more modules that exist as separate modules and/or module functions described herein can be spread over multiple modules.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. An integrated circuit (IC) device, comprising:
a plurality of logic blocks; and
a plurality of voltage droop detection circuits, wherein each voltage droop detection circuit includes:
a plurality of inverting stages connected in a chain, each inverting stage comprising a P-type transistor and an N-type transistor,
wherein an output of each odd-numbered inverting stage connects to an input of the P-type transistor of a following even-numbered inverting stage, and an output of each even-numbered inverting stage connects to an input of the N-type transistor of a following odd-numbered inverting stage, and
wherein the P-type transistor of each odd-numbered inverting stage is driven by a precharge signal to initialize the odd-numbered inverting stage to a known logic state, and the N-type transistor of each even-numbered inverting stage is driven by a discharge signal to initialize the even-numbered inverting stage to an inverse of the known logic state,
wherein each voltage droop detection circuit is placed in proximity to a corresponding logic block to detect a voltage droop of the corresponding logic block by:
inputting an evaluation pulse signal into the voltage droop detection circuit at each clock cycle;
monitoring a number of inverting stages in the voltage droop detection circuit that are able to switch their output logic states from their initialized logic states in response to the evaluation pulse signal inputted into the voltage droop detection circuit in each clock cycle; and
comparing the number of inverting stages that are able to switch their output logic states to a nominal value indicating how many inverting stages switch their respective output logic states under a normal voltage condition for the corresponding logic block.

2. The IC device of claim 1, wherein the voltage droop is detected when at least a threshold number of fewer inverting stages are able to switch their output logic states as compared to the nominal value.

3. The IC device of claim 1, wherein each voltage droop detection circuit includes a plurality of flip-flops (FFs) coupled to respective outputs of the plurality of inverting stages to sample the output logic states in each clock cycle.

4. The IC device of claim 3, wherein each odd-numbered inverting stage is coupled to a corresponding flip-flop via an inverter.

5. An integrated circuit (IC) device, comprising:
a voltage droop detection circuit including a plurality of inverting stages connected in a chain, each inverting stage comprising a P-type transistor and an N-type transistor,
wherein an output of each odd-numbered inverting stage connects to an input of the P-type transistor of a following even-numbered inverting stage, and an output of each even-numbered inverting stage connects to an input of the N-type transistor of a following odd-numbered inverting stage,
wherein the P-type transistor of each odd-numbered inverting stage is driven by a precharge signal to initialize the odd-numbered inverting stage to a known logic state, and the N-type transistor of each even-numbered inverting stage is driven by a discharge signal to initialize the even-numbered inverting stage to an inverse of the known logic state, and
wherein a voltage droop of the IC device is detected by inputting an evaluation pulse signal into the voltage droop detection circuit, and comparing a number of inverting stages that are able to switch output logic states from their respective initialized logic states to a nominal value indicating how many inverting stages switch their respective output logic states under a normal voltage condition.

6. The IC device of claim 5, further comprising:
a pulse controller circuit including:
a first pulse generator to generate the discharge signal from an input trigger signal;
an inverter to generate the precharge signal from the discharge signal; and
a second pulse generator to generate the evaluation pulse signal from the discharge signal.

7. The IC device of claim 6, wherein the first pulse generator and the second pulse generator are each configurable to generate a variable pulse width.

8. The IC device of claim 6, wherein the input trigger signal is driven by a clock signal to generate the evaluation pulse signal at each clock cycle.

9. The IC device of claim 8, further comprising:
a plurality of flip-flops (FFs) respectively coupled to the plurality of inverting stages to sample the output logic states of the inverting stages at each clock cycle for comparison with the nominal value.

10. The IC device of claim 5, wherein the voltage droop is detected when at least a threshold number of fewer inverting stages are able to switch the output logic states as compared to the nominal value.

11. The IC device of claim 5, wherein the nominal value is determined by inputting an initial evaluation pulse signal into the voltage droop detection circuit under the normal voltage condition to determine how many inverting stages switch their respective output logic states.

12. The IC device of claim 5, wherein in response to detection of the voltage droop, an operating frequency of the IC device is reduced.

13. The IC device of claim 12, wherein the operating frequency of the IC device is restored when a number of inverting stages that are able to switch output logic states reaches to within a threshold number of the nominal value.

14. The IC device of claim 5, wherein the voltage droop detection circuit includes more inverting stages than the nominal value.

15. The IC device of claim 5, wherein the voltage droop detection circuit includes at least 100 inverting stages.

16. A method to detect voltage droop in an integrated circuit (IC) device comprising:
- at each clock cycle of a clock signal:
  - initializing a chain of inverting stages to alternating logic states during an initialization phase of the clock cycle; and
  - inputting an evaluation pulse signal into the chain of inverting stages during an evaluation phase of the clock cycle;
- comparing a number of inverting stages that are able to switch output logic states from their respective initialized logic states at each clock cycle to a nominal value indicating how many inverting stages switch their respective output logic states under a normal voltage condition; and
- detecting a voltage droop of the IC device when at least a threshold number of fewer inverting stages are able to switch the output logic states as compared to the nominal value.

17. The method of claim 16, further comprising reducing an operating frequency of the IC device in response to detecting the voltage droop.

18. The method of claim 17, further comprising restoring the operating frequency of the IC device when the number of inverting stages that is able to switch output logic states reaches to within a threshold number of the nominal value.

19. The method of claim 16, wherein the evaluation pulse signal is generated from the clock signal by a pulse generator.

20. The method of claim 16, wherein a number of inverting stages in the chain of inverting stages is greater than the nominal value.

* * * * *